US012401465B1

(12) United States Patent
Maciupa et al.

(10) Patent No.: US 12,401,465 B1
(45) Date of Patent: Aug. 26, 2025

(54) INDEPENDENT BIT ERROR RATE TEST DEVICE

(71) Applicants: David M. Maciupa, Dayton, OH (US); Jonathan D. P. Ousley, Fredericksburg, VA (US)

(72) Inventors: David M. Maciupa, Dayton, OH (US); Jonathan D. P. Ousley, Fredericksburg, VA (US)

(73) Assignee: United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 18/590,005

(22) Filed: Feb. 28, 2024

(51) Int. Cl.
| | |
|---|---|
| *H04B 17/00* | (2015.01) |
| *G01R 23/16* | (2006.01) |
| *G01R 29/26* | (2006.01) |
| *G01R 31/00* | (2006.01) |
| *G01R 31/317* | (2006.01) |
| *H04B 17/309* | (2015.01) |
| *H04L 1/20* | (2006.01) |

(52) U.S. Cl.
CPC .............. *H04L 1/203* (2013.01); *G01R 23/16* (2013.01); *G01R 29/26* (2013.01); *G01R 31/002* (2013.01); *G01R 31/3171* (2013.01); *H04B 17/346* (2023.05)

(58) Field of Classification Search
CPC ...... G01R 23/16; G01R 29/26; G01R 31/002; G01R 31/3171; H03D 1/04; H03D 3/00; H04B 7/216; H04B 17/00; H04B 17/346; H04L 1/203; H04L 5/12

USPC ......... 370/249, 332–335; 375/219, 224, 227, 375/228, 260, 262, 267, 295, 316, 325, 375/341, 346
See application file for complete search history.

(56) References Cited

U.S. PATENT DOCUMENTS

| | | | |
|---|---|---|---|
| 2002/0122397 A1* | 9/2002 | Ling | H04W 52/12 370/335 |
| 2011/0280296 A1* | 11/2011 | Wang | H04L 1/0036 375/262 |

OTHER PUBLICATIONS

Fan et al., "BER Testing of Communication Interfaces", May 2008, IEEE, pp. 897-905, (Year: 2008).*

* cited by examiner

*Primary Examiner* — Shawkat M Ali
(74) *Attorney, Agent, or Firm* — Gerhard W. Thielman

(57) ABSTRACT

An electronic device is provided for conducting an independent bit error rate (BER) test to measure signal noise from a communication system that receives a radio frequency (RF) signal through a power combiner. The device includes a demodulator, a test bit pattern generator, a bit pattern comparator, a modulator and a computation processor. The demodulator receives the RF signal. The pattern generator provides a set bit sequence pattern. The bit pattern comparator compares the sequence pattern and the RF signal as a comparative signal. The modulator provides the sequence pattern from the generator as a carrier signal to the power combiner. The computation processor calculates BER from the comparative signal. In alternative embodiments, the generator, modulator, demodulator and comparator are combined as an efficient modem.

3 Claims, 5 Drawing Sheets

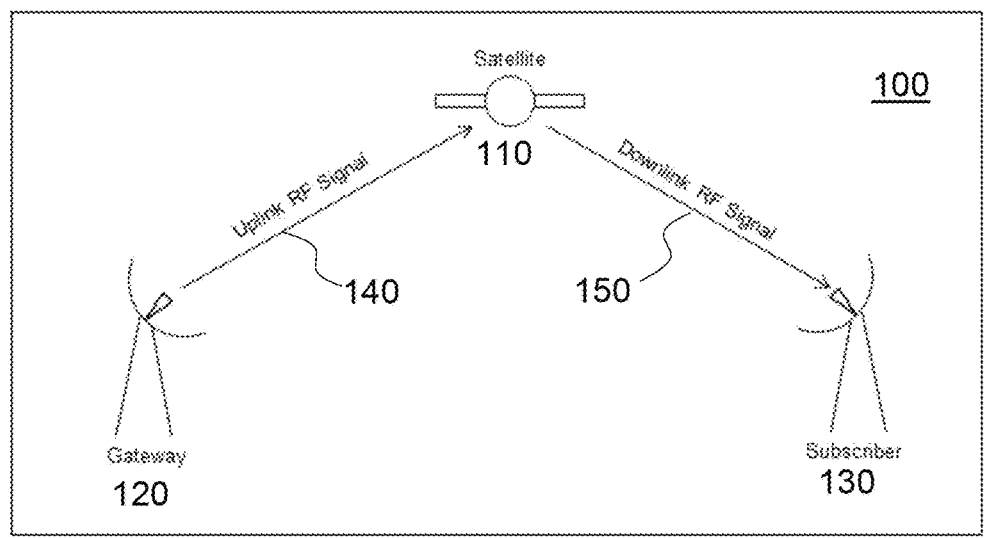
FIG. 1  Basic Satellite Link Illustration  Related Art
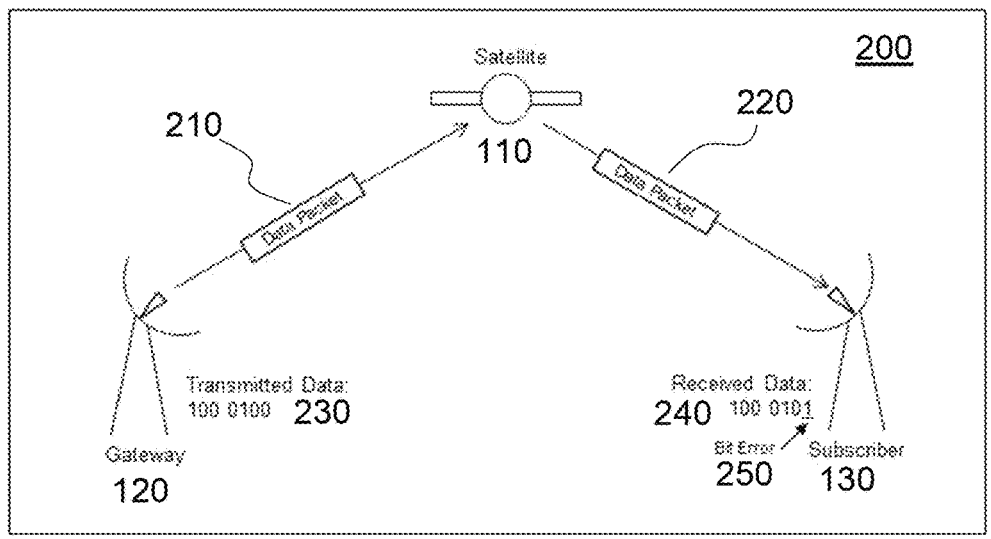
FIG. 2  Standard Over-The-Air Bit Error Rate Test  Related Art
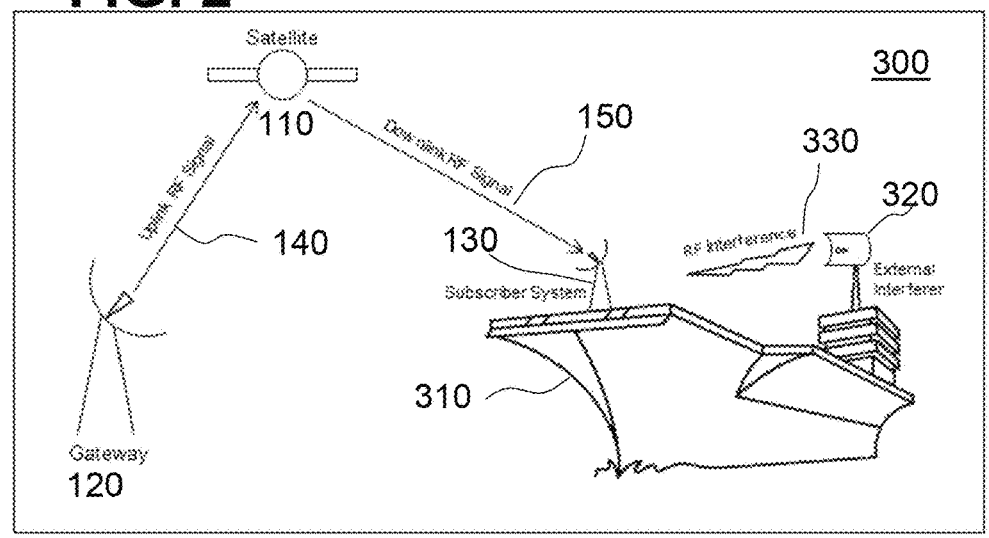
FIG. 3  External Interferer at Subscriber System

INDEPENDENT BIT ERROR RATE TEST DEVICE

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to satellite communication. In particular, the invention relates to interference assessment regarding communication via orbiting satellite relays.

FIG. 1 shows a schematic view 100 of a conventional satellite communication link. An orbiting relay satellite 110 provides a communications interface between a transmitting gateway 120 and a receiving subscriber 130, both on or near earth's surface. The gateway 120 emits an uplink radio frequency (RF) signal 140 to the satellite 110, which in turn provides a downlink RF signal 150 to the subscriber 130.

Satellite Communication (SATCOM) Systems depend on a Radio Frequency (RF) transceiver on an orbiting satellite 110 to receive an uplink from one earth station (gateway) 120 and re-transmit it through a downlink to a subscriber 130 to exchange data in view 100. This process is also performed in reverse to send data from the subscriber 130 back to the gateway 120. There are many factors which can degrade the integrity of the data as the signals travel from the gateway 120 to the subscriber 130.

FIG. 2 shows a schematic view 200 of a conventional satellite communication link. As with view 100, communication commences between the gateway 120 and the subscriber 130 via the satellite 110. The gateway 120 transmits an upload data packet 210 the satellite 110 that in turn forwards the data packet 220 to the subscriber 130 to as received data 240 and associated bit error 250.

Conducting a bit error rate test (BERT) between the gateway 120 and the subscriber 130 in view 200 constitutes a common technique to evaluate the quality of the link. The BERT operates by generating a known data sequence or pattern at the gateway 120, transmitting it over the link to the subscriber 130, and comparing it to the expected pattern. Information bits that are received incorrectly are known as errors, and the bit error rate (BER) describes the ratio of error bits to total bits sent.

SUMMARY

Conventional bit error tests yield disadvantages addressed by various exemplary embodiments of the present invention. In particular, various exemplary embodiments provide an electronic device for conducting an independent bit error rate (BER) test to measure signal noise from a communication system that receives a radio frequency (RF) signal through a power combiner. The device includes a demodulator, a test bit pattern generator, a bit pattern comparator, a modulator and a computation processor. The demodulator receives the RF signal. The pattern generator provides a set bit sequence pattern. The bit pattern comparator compares the sequence pattern and the RF signal as a comparative signal. The modulator provides the sequence pattern from the generator as a carrier signal to the power combiner. The computation processor calculates BER from the comparative signal. In alternative embodiments, the generator, modulator, demodulator and comparator are combined as an efficient modem.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which:

FIG. 1 is a schematic view of a conventional satellite link;

FIG. 2 is a schematic view of a conventional over-the-air bit error rate test (BERT);

FIG. 3 is a schematic view of a external interferer in a subscriber system;

DETAILED DESCRIPTION

Figure 4:
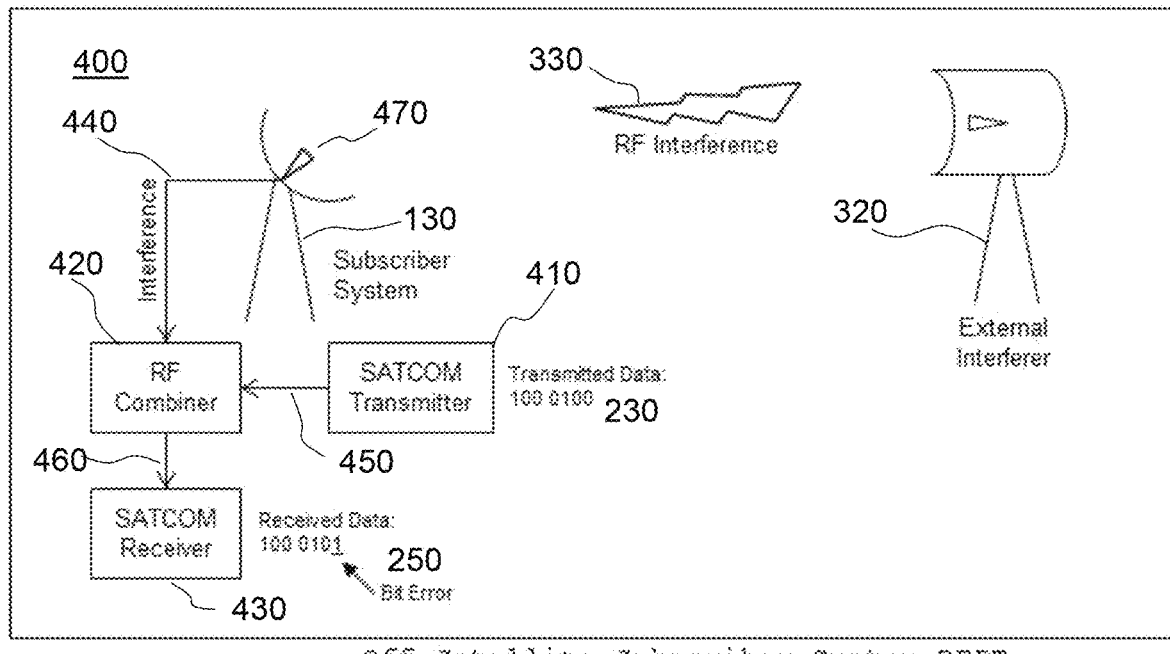
FIG. 4 is a schematic view of an off-satellite subscriber BERT.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, artisans of ordinary skill will readily recognize that devices of a less general purpose nature, such as hardwired devices, may also be used without departing from the scope and spirit of the inventive concepts disclosed herewith. General purpose machines include devices that execute instruction code. A hardwired device may constitute an application specific integrated circuit (ASIC), a field programmable gate array (FPGA), digital signal processor (DSP) or other related component.

The disclosure generally employs quantity units with the following abbreviations: length in meters (m), time in seconds(s), frequency in hertz (Hz), power in decibels (dBm), angles in degrees) (°, force in newtons (N), temperature in kelvins (K) and energy in joules (J). Supplemental measures can be derived from these, such as density in grams-per-cubic-centimeters ($g/cm^3$), moment of inertia in kilogram-square-meters ($kg\text{-}m^2$) and the like.

Exemplified embodiments provide an independent or unmanned Bit Error Rate Test (UBERT) to conduct an automated Satellite Communication (SATCOM) electromagnetic interference (EMI) Test. UBERT can be conducted without requiring distant-end support and coordination with a remote gateway 120, a valid satellite assignment, or manual determination of frequency or power settings.

FIG. 3 shows a schematic view 300 of a satellite communication link that experiences interference. A naval combat ship 310 (e.g., aircraft carrier) includes a separate transmitter 320 that emits RF interference 330. Meantime, the gateway 120 transmits to the subscriber 130 via the satellite 110, while the subscriber 130 is subject to the RF interference 330.

In some SATCOM system installations, the suspected source of degradation can be isolated to EMI caused by an external RF emitter 320 operating in close proximity to the subscriber antenna system 130 in view 300. In these scenarios, one factor that determines the level of degradation is the pointing angle of the SATCOM antenna. Therefore, one would preferably steer the antenna of the subscriber 130 manually away from the satellite 110 during a controlled test event to evaluate the degradation as the pointing angle changes.

FIG. 4 shows a schematic view 400 of an off-satellite communication link that experiences interference. This includes a SATCOM transmitter 410, an RF combiner 320 with transmitted data 230 and a SATCOM receiver 430 with received data 240 with the error bit 250 for the bit error rate test (BERT). The RF interference 330 from the transmitter 320 reaches the subscriber 130, which passes signal interference 440 to the combiner 420, which also receives a transmit signal 450 from the SATCOM transmitter 410. The combiner 420 joins the signals 440 and 450 as a combination signal 460 to the SATCOM receiver 430. The subscriber 130 includes an antenna 470 for receiving signals 150 and 330.

In order to perform a bit error rate test (BERT) while the subscriber 130 is not connected to a satellite 110, a local BERT can be used shown in view 400. In this arrangement, the SATCOM transmitter 410 replaces the downlink 150 from the satellite 110 and is combined with the RF interference 330 to be received by the subscriber antenna 470.

Figure 5:
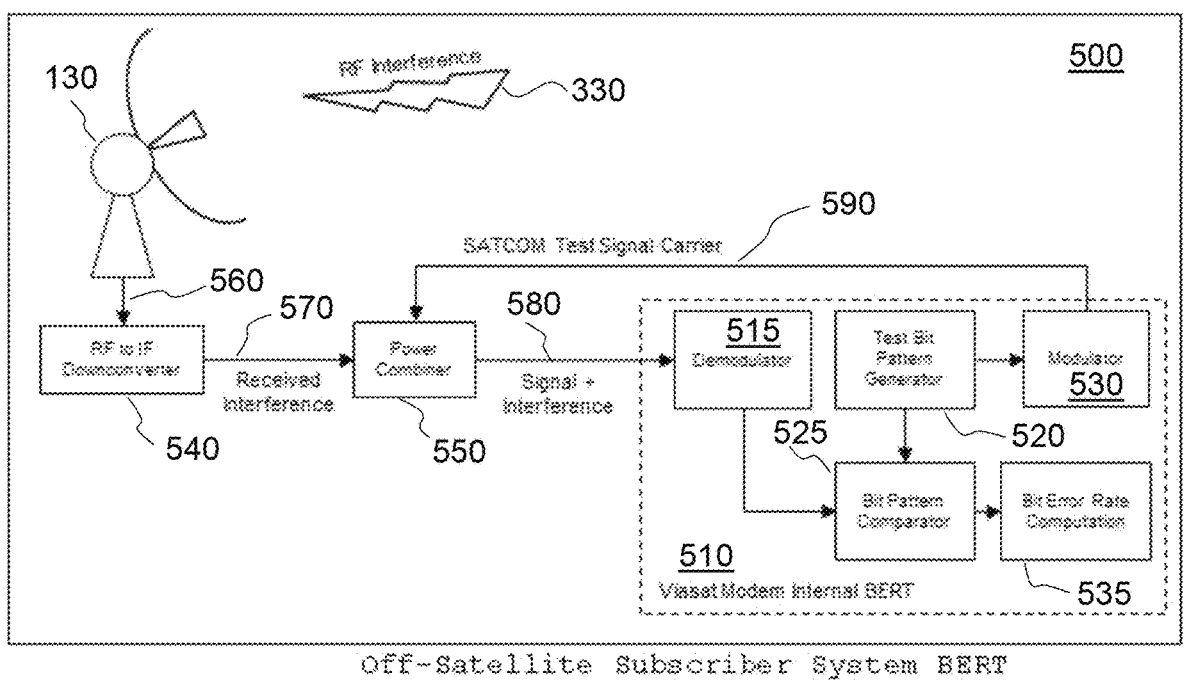
FIG. 5 is a block diagram view of the off-satellite subscriber BERT.

FIG. 5 shows a block diagram view 500 of an off-satellite communication link that experiences interference. A via-sat modem internal UBERT module 510 processes signals, both RF and intermediate frequency (IF). The BERT 510 includes a demodulator 515, a test bit pattern generator 520, a bit pattern comparator, a modulator 530 and a bit error rate (BER) computer 535. The generator 520 provides a set bit sequence as a standard for comparison. The comparator 525 receives signals from the demodulator 515 and generator 520, which also sends comparative signals to the modulator 530. The BER computer 535 receives these comparative signals from the comparator 525.

The UBERT 510 communicates with an RF-to-IF downconverter 540 and a power combiner 550. The downconverter 540 receives an interference signal 560 from the subscriber 130 and passes that receiver signal 570 to the power combiner 550, which transmits a combined signal-and-interference signal 580 to the demodulator 515. The combiner 550 receives a SATCOM test signal carrier 590 from the modulator 530 in response to the generator 520.

This test illustrated in view 500 shows implementation with a Viasat MD-1366 Enhanced Bandwidth Efficient Modem (EBEM) that combines the modulator 530 and demodulator 515. The EBEM (880 in FIG. 8) conveniently provides the BERT pattern generator 520, modulator 510 and demodulator 515, and comparator 525 in a consolidated UBERT device 510.

Description and operation. The exemplary Unmanned BERT (UBERT) system includes the UBERT device 510 associated with the downconverter 540 and power combiner 550. This exemplary UBERT system is intended to operate while the subscriber system 130 connects to the satellite 110. This eliminates the need for the conventional controlled test event as previously described, which is labor intensive and prohibits normal SATCOM system operation for the duration of the error test. Additionally, unlike the over-the-air BERT shown in view 200, the UBERT system does not depend on the gateway 120 or satellite services to conduct an error test.

This is achieved by using a BERT configuration similar to that shown in view 400, but with the SATCOM transmitter 410 configured to transmit on a different channel than that assigned to the subscriber 130 by the satellite provider. This permits the subscriber 130 to remain connected to the satellite 110 and maintain a communication link 150 using its assigned channel as the test signal carrier 590.

Figure 6:
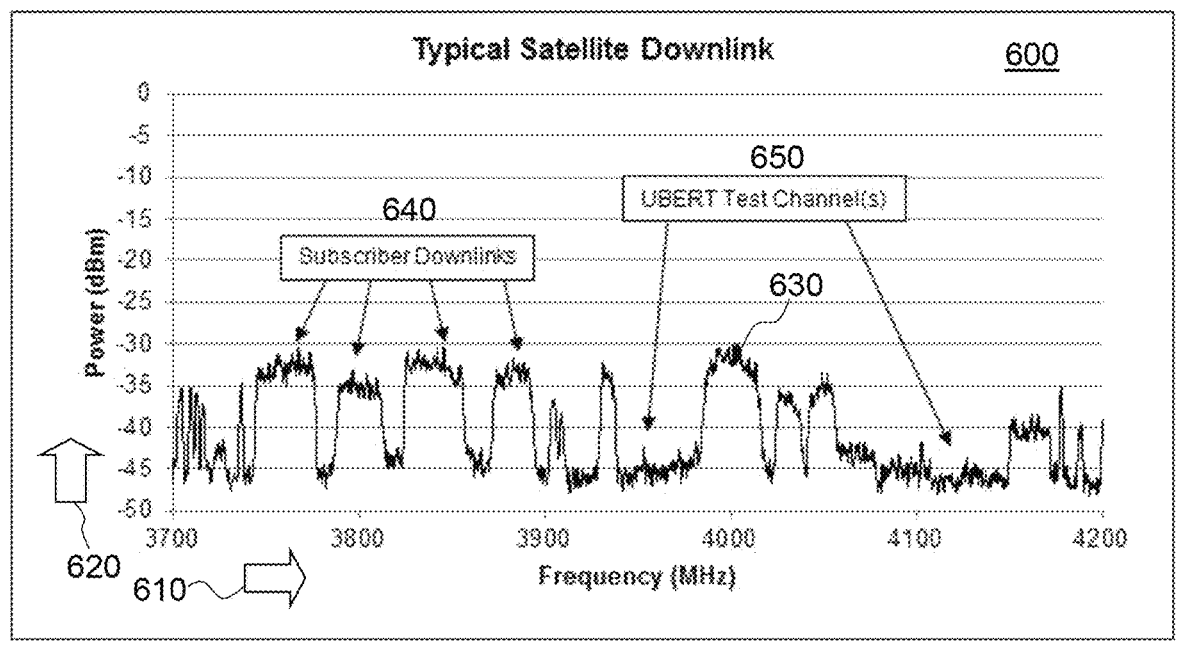
FIG. 6 is a graphical diagram view of satellite downlink with potential test channels.

FIG. 6 shows a graphical view 600 of a satellite downlink plot. Frequency 610 (MHz) denotes the abscissa, while power 620 (dBm) denotes the ordinate. A signal trace 630 includes subscriber downloads 640 at approximately between −30 dBm to −35 dBm and UBERT test channels 650 at −45 dBm that represent noise.

Figure 7:
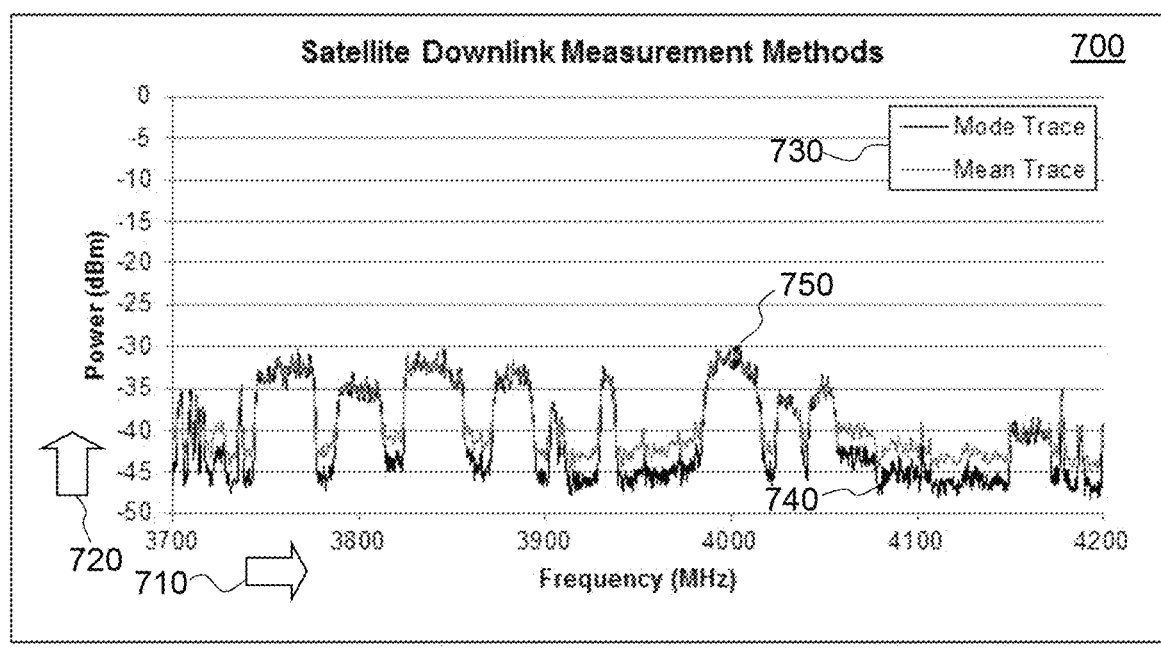
FIG. 7 is a graphical view of satellite downlink measurement techniques.

FIG. 7 shows a graphical view 700 of a signal measurement plot. Frequency 710 (MHz) denotes the abscissa, while power 720 (dBm) denotes the ordinate. A legend 730 identifies separate traces as mode 740 and mean 750, with the latter being about 3 dBm higher at the UBERT levels than the former. View 700 illustrates an example of the scenario where the lowest portions of the mean trace 750 have been elevated by interference, while the mode trace 740 reports the correct values. This is especially important while determining the transmit power necessary for the test, as the trace obtained with the mean trace 750 would result in testing with too high of a power level. This key change greatly improved the accuracy of the test for those types of interference and was adopted as the primary measurement technique for all circumstances.

Figure 8:
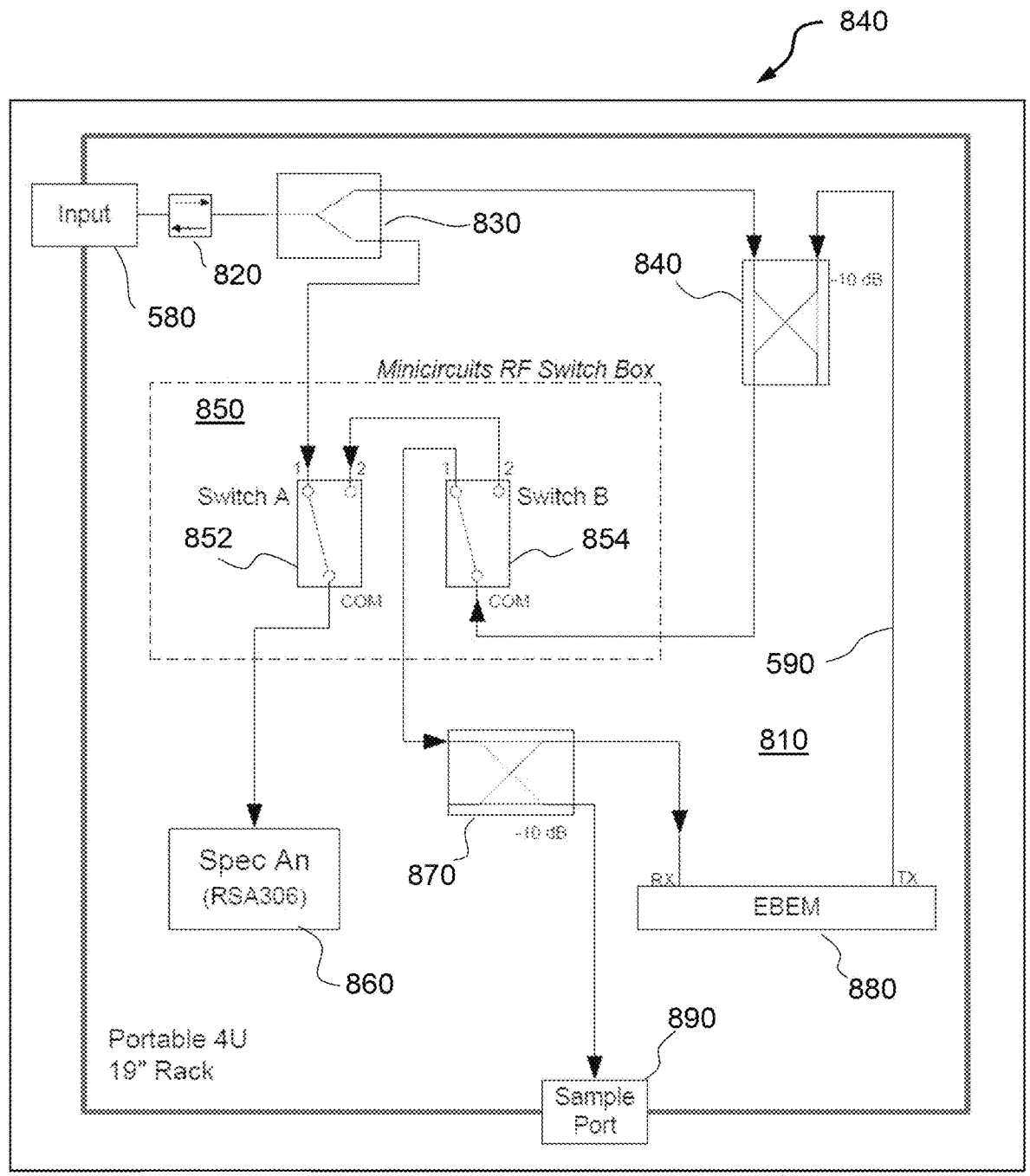
FIG. 8 is a block diagram view of an unmanned BERT radio frequency hardware diagram.

FIG. 8 shows a block diagram view 800 of an exemplary RF hardware schematic 810 for the UBERT 510. This includes an input 580, a playback device 820, a signal splitter 830, a −10 dB signal combiner 840, a minicircuit RF switch box 850 with switches A 852 and B 854, spectrum analyzer 860, a −10 dB signal divider 870, an enhanced bandwidth efficient modem (EBEM) 880 with receive and transmit electrodes, and a sample port 880 for a channel, such as the test signal carrier 590.

The exemplary Unmanned BERT system addresses two additional problems which arise with this new test methodology. First, UBERT 510 uses a RF spectrum analyzer to characterize the downlink and determine the location of vacant channel appropriate for testing in view 600. This is accomplished using an algorithm that compares the relative flatness and amplitude of potential channels; the optimal test channel has a lowest amplitude and flattest profile.

Second, the Unmanned BERT system must determine the transmit power level used to simulate the subscriber downlink. The UBERT 510 must determine a realistic level, because too high of a power level will fail to detect degradation and too low of a level will report degradation too often. This operated is accomplished using a spectrum analyzer 860, which calculates the power received in the test channel over a short period to determine the noise floor of that channel 865.

All components of the exemplary Unmanned BERT system utilize commercial off-the-shelf (COTS) components connected in hardware 810 that are controlled by software written in MATLAB. The primary components are the Viasat MD-1366 EBEM 880, which provides both the SATCOM transmitter and receiver functions using an embedded BERT test mode, and a Tektronix RSA306, which is a compact universal serial bus (USB) real-time spectrum analyzer 860 capable of performing the required RF measurements through an application programming interface (API). The RF Hardware arrangement is shown in view 800.

Figure 9:
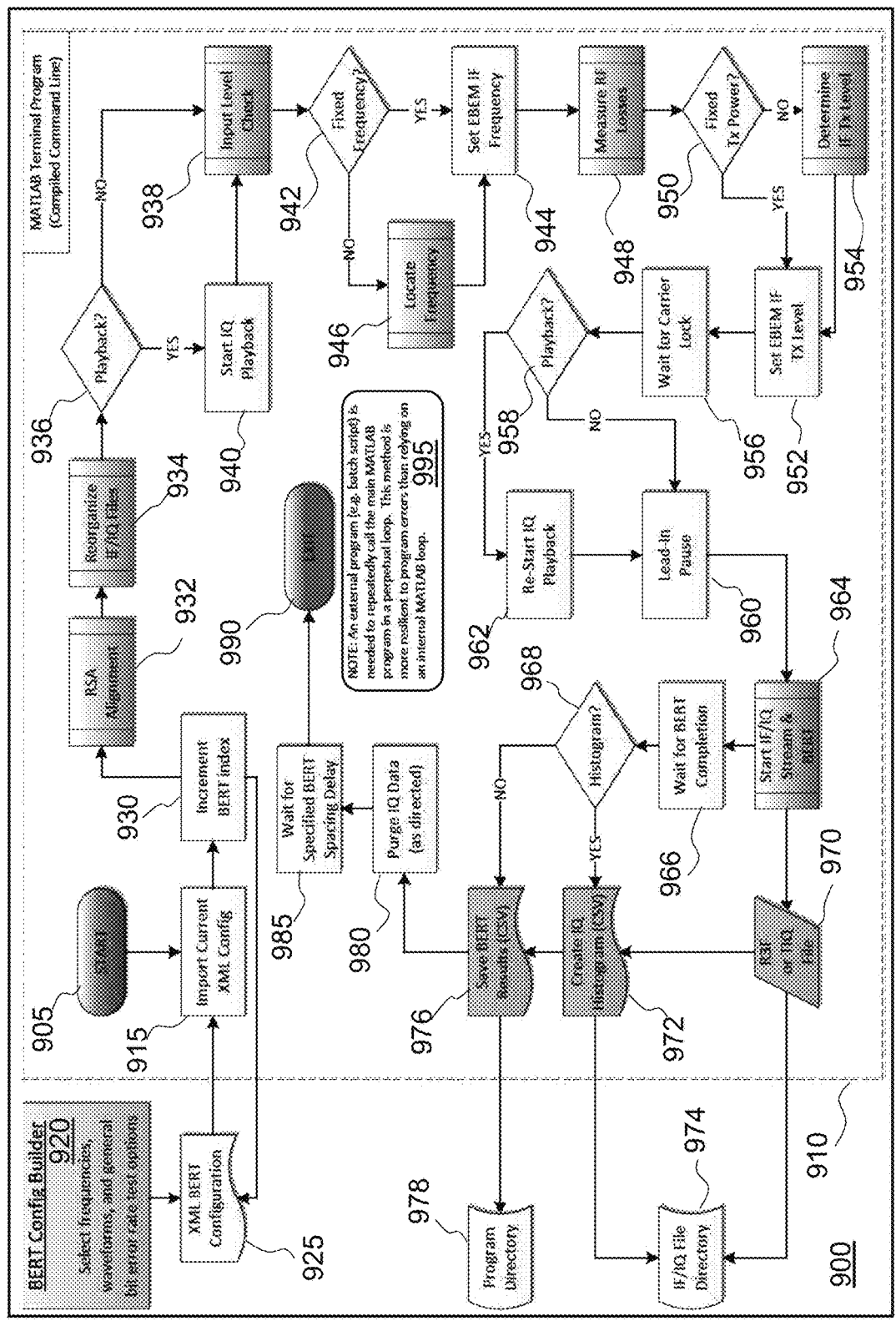
FIG. 9 is a flowchart diagram view of a BERT configuration.

FIG. 9 shows a flowchart diagram view 900 of an unmanned BERT software flow diagram that begins at start 905 within a MATLAB terminal program 910 referred to as software. Start 905 initiates receipt by an import extensible markup language (XML) configuration 915 of input data 580 by a BERT configuration builder 920 that formats the data by XML BERT configuration 925. The data in the builder 920 include select frequencies, waveforms and bit error rate test options. An increment BERT index 930 receives the data from the configuration 920 to determine RSA alignment 932 and to reorganize IF/IQ files 934. Note that IQ data includes projection and phase.

A first playback decision query 936 determines whether to replay the data. A negative response continues to input level check 938, whereas a positive response initiates IQ playback 940 before resuming to the check 938 that proceeds to a fixed frequency query 942. A positive response sets EBEM IF frequency 944, whereas a negative response diverts to locating the frequency 946 before resuming to the set frequency operation 944 before continuing to measuring RF losses 948.

This measurement from operation 948 leads to a power query 950 for fixed transmission. A positive response sets EBEM IF transmission level 952, while a negative response diverts to determine IF transmission level 954. From the set level operation 952, the process continues to waiting for carrier lock 956 and proceeding to a second playback query 958. A negative response initiates a lead-in pause 960. A positive response diverts the process to restart IQ playback 962 before resuming to the lead-in pause 960 that proceeds to starting IF/IQ stream and BERT operation 964. The process waits for BERT completion 966 before reaching a histogram query 968. The stream and BERT operation 964 also retrieves an R3F or TIQ file 970 to create an IQ histogram 972, both of which then write to an IF/IQ file directory 974. The histogram 972 is written in comma separated values (CSV) format.

The create histogram operation 972 also saves BERT results 976 as CSV. A positive response to the histogram query 968 proceeds to the create histogram 972 operation, whereas a negative response resumes to the save results 976 in a program directory 978. The operation proceeds to purge IQ data 980, following the save operation 976. The operation proceeds to wait for specified BERT spacing delay 985 before ending 990. Flowchart view 900 further includes a note 995 of batch script to call MATLAB in a perpetual loop.

Software Walkthrough: The software 910 controlling the exemplary Unmanned BERT system is illustrated as the flow chart in view 900 as previously described. In order to script what type of test is conducted the operator must define a configuration file using the "BERT Configuration Builder" 920.

The process begins 905 by importing the builder file 920 to learn what type of test is to be performed. Next, the spectrum analyzer 860 undergoes an alignment routine that requires the RF switches 852 and 854 to move to a disconnected state. Following alignment, the software 910 determines whether there is enough file space to store a digital recording of the RF energy. If not, the software 910 moves files as needed to external data storage.

If the test configuration as query 936 is set for lab playback, the software initiates file playback 940 via an application programming interface (API) with a COTS RF playback device 820 connected to the UBERT system input 580. Next, the software 910 uses the spectrum analyzer 860 to measure the power level at the input 580 of the UBERT system to ensure satisfaction above the sensitivity threshold of the spectrum analyzer 860; thus providing valid measurement values.

If the configuration is set to locate a vacant SATCOM channel (as opposed to a fixed frequency) as query 942, the spectrum analyzer 860 acquires the trace and the software 910 computes moving mean and moving standard deviation values to determine the best channel for testing. To ensure that the modem 880 is still properly connected to the UBERT system, the software next executes two RF loss measurements 948 to determine the loss between the modem transmitter and receiver ports, and between the modem transmitter and spectrum analyzer ports.

If the configuration 925 calls for dynamic setting of the transmit power level as query 950, the software 910 proceeds with measuring the mode of the selected SATCOM channel and using a lookup table to achieve the desired signal-to-noise ratio at the receiver on the modem 880. This can be accomplished even in the presence of pulsed interference due to measuring the statistical mode of the channel. Once the transmit level is determined as query 950, the software 910 re-starts the playback 962 if needed as query 958, and then commands the modem 880 to begin a built-in BERT test sequence.

Simultaneously with the UBERT 510, the spectrum analyzer 860 is commanded to capture the interference waveform—without the SATCOM transmitted signal 410—for later analysis or playback use 940. At the conclusion of the test, the captured RF data 976 are either immediately analyzed, saved to long-term storage 978, or deleted 980 if the observed BER is not noteworthy. Deleting captured data for passing BER tests is beneficial to reduce the total amount of storage required for a complete test event.

The exemplary Unmanned BERT (UBERT) system has commercial potential for any satellite systems that routinely experiences degradation due to EMI at their subscriber 130 location. Due to the use of the Viasat MD-1366 modem 880, the exemplary UBERT system is targeted for military applications and was developed to specifically address EMI concerns aboard the USS Gerald R. Ford (CVN 78). Due to the limited time available for dedicated EMI testing aboard CVN 78, a system that can autonomously collect accurate EMI measurements on a not-to-interfere basis was extremely attractive.

Exemplary embodiments provide various advantages over conventional techniques for signal. The Unmanned BERT system has an advantage over other test systems and methodologies because it can be deployed on an existing SATCOM system and performs accurate EMI measurements without interfering with SATCOM operations. Additionally, automation enables these tests to be performed without manual interaction that makes obtaining these measurements more cost effective.

Using a spectrum analyzer 860 to collect traces weighted by their statistical mode is an innovative approach to locating a vacant downlink channel, despite the presence of significant pulsed interference, for the purpose of conducting a BERT 510 to evaluate downlink interference 150. Additionally, using the same measurement technique to accurately set the transmit power level of the BERT 510 is also a novel and effective approach. The Spectrum Analyzer integrated with the Unmanned BERT system also provides the ability to digitally record the interference during the test, which adds a capability of indefinite playback in a lab environment. The Unmanned BERT software 910 supports this capability by enabling the operator to specify files for playback and automatically repeats the BERT 510 using the same algorithms as though it were running a field test.

One aspect of the exemplary process includes obtaining the RF power traces to both locate a vacant channel and determine the appropriate transmit power level. Prior to this, the spectrum analyzer 860 was configured to measure an "average trace" from which to compute the statistical mean of approximately one-hundred individual traces to determine the noise level without being influenced by pulsed interference. This proved ineffective for some types of interference. The solution was to calculate the statistical mode, rather than mean, which was less influenced by high duty-cycle interference. This measurement technique is not a common feature of spectrum analyzers and requires an additional calculation in the unmanned BERT software to implement.

Alternatives to the Unmanned BERT system include other methods that decode the satellite downlink and predict BERs. These can be very useful and accurate, but are limited to only assessing the conventional satellite assignment. The exemplary system can locate test channels anywhere within the receive frequency range and perform tests at those locations. Another alternative is to manually perform BERTs, but this is labor-intensive and often unfeasible for extended test periods.

On-Air Testing: Conventional testing requires terminating the data link (disrupting service) and moving into a test mode. By contrast, the exemplary UBERT 510 enables the user's data link to remain connected and tests an appropriate neighboring channel. This channel is exposed the same interference conditions to be evaluated as the data link for communication. UBERT 510 couples the test signal from the subscriber 130 into the same path that receives interference 330.

Automatic Channel Detection and Level Setting: The algorithms within UBERT 510 automatically measure the spectrum and determine the optimal RF channel to perform the test. Additionally, the power level at which to run the test is determined automatically—this is a critical aspect of obtaining meaningful results. UBERT 510 accomplishes this with a digital signal processing algorithm to measure the RF energy and calculate the required power levels.

Data Collection Automation: All data, to include both test logs and high-fidelity recordings of the spectrum when anomalous conditions are detected, is automatically created and retained for in-depth analysis at the end of the event. UBERT 510 accomplishes this with an algorithm that compares measured performance of the bit-error-rate test to a user-configurable threshold. Under circumstances in which the performance does not satisfy the threshold, the data are automatically archived by the system for later analysis.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. An electronic device for conducting an independent bit error rate (BER) test to measure signal noise from a communication system that receives a radio frequency (RF) signal through a power combiner, said device comprising:
   a demodulator for receiving the RF signal from the power combiner and producing a demodulated signal;
   a test bit pattern generator for providing a set bit sequence pattern;
   a bit pattern comparator for comparing said sequence pattern and demodulated signal as a comparative signal;
   a modulator for providing said sequence pattern from said generator as a carrier signal to the power combiner; and
   a computation processor for calculating BER from said comparative signal.

2. The device according to claim 1, wherein said generator, modulator, demodulator and comparator are combined as an efficient modem.

3. The device according to claim 2, further comprising:
   a playback device for receiving the RF signal;
   a signal splitter for splitting the RF signal into first and second input signals;
   a switch circuit having first and second switches, said first switch for receiving said first input signal and a third input signal to provide said comparative signal, and said second switch for receiving said second input signal to provide said third input signal and a fourth input signal;
   a signal combiner for combining said second input signal with said carrier signal into a feedback signal to the power combiner;
   a spectrum analyzer for receiving said comparative signal for determining received signal power; and
   a signal divider for providing said fourth input signal to said efficient modem.

* * * * *